United States Patent [19]

Muro

[11] Patent Number: 5,130,529
[45] Date of Patent: Jul. 14, 1992

[54] SEMICONDUCTOR OPTICAL POSITION SENSING DEVICE

[75] Inventor: Hideo Muro, Yokohama, Japan

[73] Assignee: Nissan Motor Co., Ltd., Yokohama, Japan

[21] Appl. No.: 649,836

[22] Filed: Feb. 5, 1991

[30] Foreign Application Priority Data

Feb. 20, 1990 [JP] Japan .................................. 2-37507

[51] Int. Cl.$^5$ ............................................. H01J 40/14
[52] U.S. Cl. .............................. 250/214 L; 250/208.1; 250/206.1
[58] Field of Search .............. 250/214 L, 208.1, 201.2, 250/206.1; 356/223

[56] References Cited

U.S. PATENT DOCUMENTS

4,841,138  6/1989  Muro ................................ 250/214 L

Primary Examiner—Carolyn E. Fields
Assistant Examiner—Drew A. Dunn
Attorney, Agent, or Firm—Foley & Lardner

[57] ABSTRACT

The semiconductor optical position sensing device comprises an optical position sensing element having two electrodes for generating two photoelectric currents changeable according to an optical position between the two electrodes, two current mirror circuits for converting the two photoelectric currents into two currents respectively; two transistors for converting the two currents into two voltages, respectively; two source followers; and a differential circuit connected between the two transistors via the two source followers, respectively, for differentially generating an optical position current signal on the basis of the two converted voltages. Further, the two source followers are composed of four parallel connected JFETs diagonally arranged close to each other in mutual intersectional positional relationship with respect to each other. Additionally, the two constant current sources are composed of four similarly-arranged JFETs. It is therefore, possible to minimize an offset error in the differential circuit. Further, since no divider is required, all the composing elements can be integrated into a single chip.

2 Claims, 6 Drawing Sheets

SEMICONDUCTOR OPTICAL POSITION SENSING DEVICE

BACKGROUND OF THE INVENTION

1. Field of the Invention

The present invention relates to a semiconductor optical position sensing device for detecting the positions of optical beam projected on a semiconductor optical position sensing element.

2. Description of the Prior Art

Figure 1:
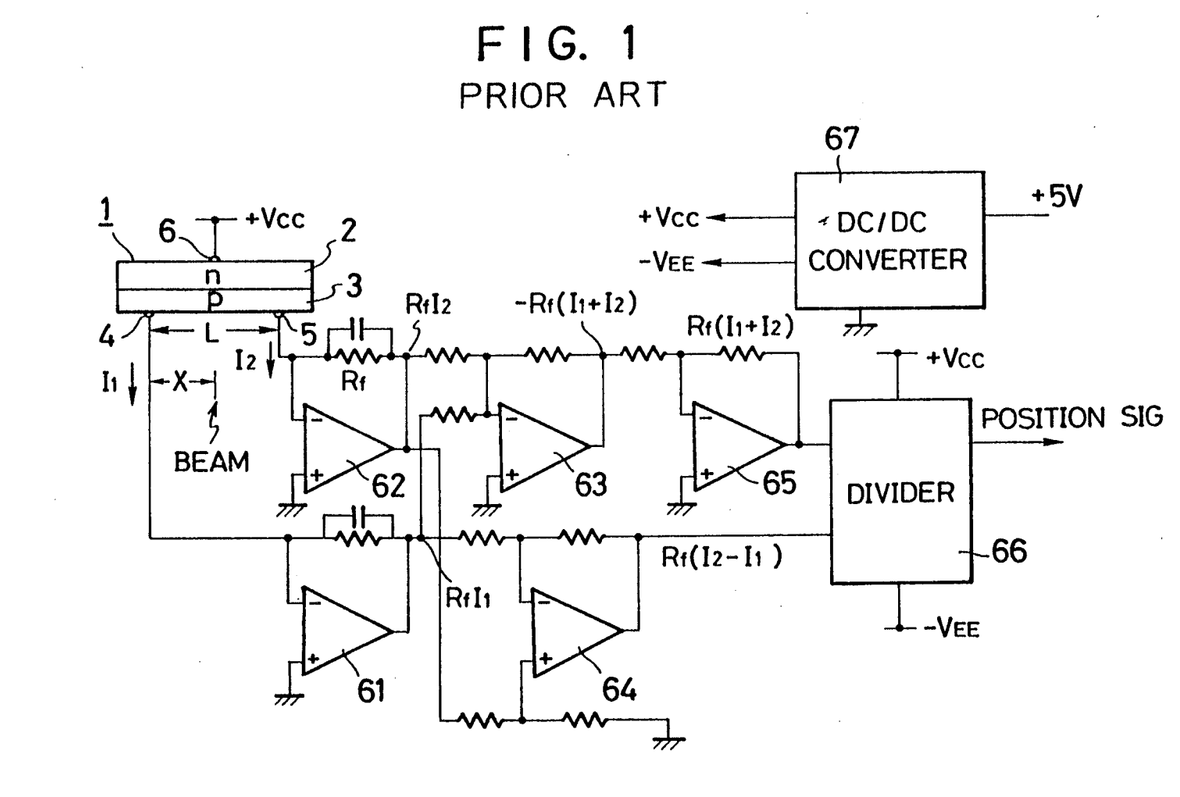
FIG. 1 is a circuit diagram showing a prior-art optical position sensing apparatus.

An example of prior-art optical position sensing apparatus is disclosed in "Semiconductor Position Sensor and Its Application" ELECTRONIC MATERIAL, P119, Feb. 1980, as shown in FIG. 1.

In the drawing, an optical position sensing element 1 is formed with a flat and square-shaped light sensing plane of a pn junction of a high resistivity n-type Si, i.e., substrate 2 and a p-type layer 3. A first electrode 4 and a second electrode 5 are formed at an interval L near the two opposing side edges thereof. A first photoelectric current $I_1$ can be detected through the first electrode 4 and a second photoelectric current $I_2$ can be detected through the second electrode 5.

On the other hand, an n+ contact layer (not shown) is formed all over the outer surface of the Si substrate 2, and an electrode 6 is formed all over or on a portion of the n+ contact layer. A positive voltage $+V_{CC}$ is applied to the electrode 6 to reverse bias the pn junction of the sensing element.

A signal processing circuit as shown in FIG. 1 is connected to the optical position sensing element 1 to process the first and second photoelectric currents $I_1$ and $I_2$ detected through the first and second electrodes 4 and 5, respectively.

In more detail, the processing circuit comprises two current-voltage (C-V) converters 61 and 62, an adder 63, a subtracter 64, an inverter 65, a general purpose divider 66 and a DC-DC converter 67. The above C-V converters 61 and 62, adder 63, subtracter 64 and inverter 65 are all of the operational amplifier type. Further, the divider 66 is driven by voltages $+V_{CC}$ and $-V_{EE}$ supplied by the DC-DC converter 67.

In operation, when a light beam is projected on a position X ($0 \leq X \leq L$) between the two electrodes 4 and 5 of the optical position sensing element 1, the first photoelectric current $I_1$ detected through the first electrode 4 and the second photoelectric current $I_2$ detected through the second electrode 5 both change relatively according to the optical position X as expressed below:

$$I_1 = I_0 \cdot (L-X)/L \qquad (1)$$

$$I_2 = I_0 \cdot X/L \qquad (2)$$

where $I_0$ denotes the overall photoelectric current ($I_1 + I_2$) generated by the optical beam irradiation.

The first and second photoelectric currents $I_1$ and $I_2$ are converted into first and second voltages $R_f \cdot I_1$ and $R_f \cdot I_2$ by the current-voltage (C-V) converters 61 and 62, respectively. Both the voltages $R_f \cdot I_1$ and $R_f \cdot I_2$ are added by the adder 63 and inverted by the inverter 65 to obtain an addition voltage $R_f \cdot (I_1 + I_2)$. On the other hand, both the voltages are subtracted by the subtracter 64 to obtain a subtraction voltage $R_f \cdot (I_2 - I_1)$. The obtained subtraction voltage $R_f \cdot (I_2 - I_1)$ is divided by the addition voltage $R_f \cdot (I_1 + I_2)$ to obtain an output as follows:

$$(V_{ref}/2) \cdot (I_2 - I_1)/(I_1 + I_2) = [(X/L) - \tfrac{1}{2}] \cdot V_{ref} \qquad (3)$$

where $V_{ref}$ denotes a constant reference voltage.

The above expression (3) indicates that an optical position X can be detected by the divider 66 without being subjected to the influence of the quantity of optical beam irradiation.

In prior-art optical position sensing apparatuses as described above, since various circuit elements are required for the signal processing circuit, there exist various problems in that the number of parts is large; the size thereof is large; the cost is high; and, further, reliability is low.

SUMMARY OF THE INVENTION

With these problems in mind, it is the primary object of the present invention to provide a semiconductor optical position sensing device which can be integrated into a single chip including both the optical position sensing element and the signal processing circuit, without use of the general purpose divider, with high precision, and low cost high reliability.

To achieve the above-mentioned object, the semiconductor beam position sensing device according to the present invention comprises: (a) optical position sensing means (1) having first and second electrodes (4, 5) for generating first and second photoelectric currents ($I_1$, $I_2$), respectively, so as to be relatively changed according to an optical position (X) between the first and second electrodes; (b) first current converting means (7, 8) connected to the first electrode of said sensing means, for converting the first photoelectric current ($I_1$) into a first current ($I_{11}$); (c) second current converting means (9, 11) connected to the second electrode of said sensing means, for converting the second photoelectric current ($I_2$) into a second current ($I_{22}$); (d) first logarithmic converting means (12) connected to said first current converting means, for logarithmically converting the first current ($I_{11}$) into a first voltage ($V_A$); (e) second logarithmic converting means (13) connected to said second current converting means, for logarithmically converting the second current ($I_{22}$) into a second voltage ($V_B$); (f) first source follower means (14, 16) connected to said first logarithmic converting means, for isolating said first logarithmic converting means from the succeeding stage; (g) second source follower means (15, 17) connected to said second logarithmic converting means, for isolating said second logarithmic converting means from the succeeding stage; and (h) differential means (18, 19, 21, 22) connected between said first and second logarithmic converting means via said first and second source follower means, respectively, for differentially generating an optical position current signal ($I_f = (I_A - I_B)/(I_A + I_B) \cdot I_{ref}$) on the basis of the first and second voltages ($V_A$, $V_B$).

Further, the device preferably further comprises current-voltage converting means (27) connected to said differential means, for converting the optical position current signal ($I_f$) into an optical position voltage signal ($V_{out}$) indicative of an optical position (X) between the two electrodes of said sensing means, first buffer means (51, 53, 55) connected between the first electrode (4) of said sensing means and said first current converting means (7, 8), for applying a constant bias voltage to said sensing means through the first electrode; and second buffer means (52, 54, 56) connected between the second electrode (5) of said sensing means and said second current converting means (9, 11), for applying the same constant voltage to said sensing means through the second electrode.

In the sensing device according to the present invention, said first source follower means (14) comprises: (a) a pair of first parallel connected source follower field effect transistors (14a, 14b) diagonally arranged close to each other on a semiconductor substrate; and (b) a pair of first parallel connected constant current source field effect transistors (16a, 16b) diagonally arranged close to each other on the semiconductor substrate, and connected to sources of a pair of said first parallel connected source follower field effect transistors, and said second source follower means (15) comprises: (c) a pair of second parallel connected source follower field effect transistors (15a, 15b) diagonally arranged close to each other in intersectional positional relationship with respect to the first source follower field effect transistors (14a, 14b) on the semiconductor substrate; and (d) a pair of second parallel connected constant current source field effect transistors (17a, 17b) diagonally arranged close to each other in intersectional positional relationship with respect to the first constant current source field effect transistors (16a, 16b) on the semiconductor substrate, and connected to sources of a pair of said second parallel connected source follower field effect transistors.

In the sensing device according to the present invention, first and second photoelectric currents $I_1$ and $I_2$ are generated by the beam position sensing means in correspondence to a beam position X between the two electrodes of the sensing means. The generated photoelectric currents are converted into two currents $I_{11}$ and $I_{22}$ by the two current converting means and further converted into two voltages $V_A$ and $V_B$ by the two logarithmic converting means. The converted voltages $V_A$ and $V_B$ are applied to the differential means via two source follower means, respectively to obtain an optical position current signal: $I_f = I_A - I_B = I_{ref} \cdot (I_2-I_1)/(I_1+I_2)$. The obtained optical position current signal is converted into an optical position voltage signal: $V_{out} = V_{ST} \cdot X/L$, which indicates an optical position X between the two electrodes. Further, since the two source follower means are composed of four parallel-connected JFETs diagonally arranged close to each other in intersectional positional relationship with respect to each other and further since two constant current sources connected to the source follower means are composed of four similarly arranged JFETs, it is possible to minimize the difference in characteristics between the two source follower means and therefore eliminate an offset error in the differential means.

Further, since the two source follower means are connected between the logarithmic converting means and the differential means, respectively, it is possible to effectively prevent interference between the two means. Therefore, it is possible to realize a high reliable optical position sensing device. Further, since no divider circuit is required for the signal processing circuit, it is possible to integrate all the composing elements into a single chip, thus decreasing the size and the cost thereof.

DETAILED DESCRIPTION OF THE PREFERRED EMBODIMENTS

Embodiments of the present invention will be described hereinbelow with reference to the attached drawings.

Figure 2:
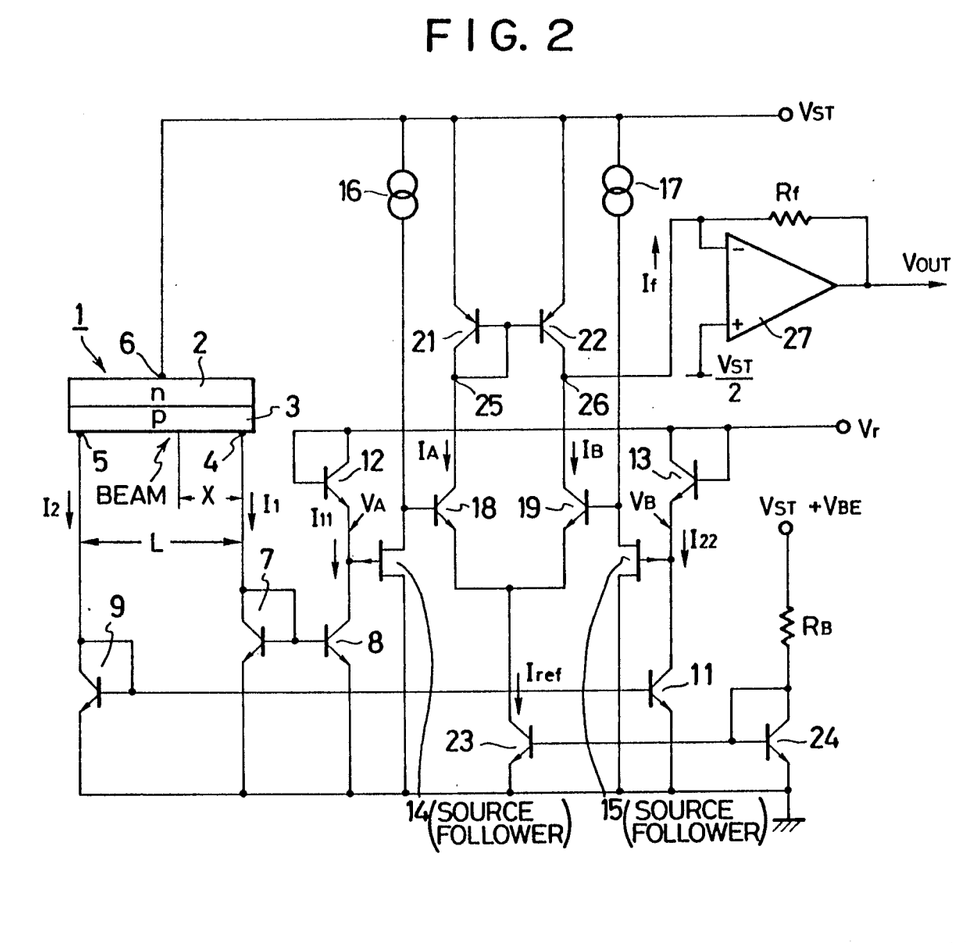
FIG. 2 is a circuit diagram showing an entire configuration of an embodiment of the semiconductor optical position sensing device according to the present invention.

FIGS. 2 to 5 show a first embodiment thereof. In FIG. 2, an optical position sensing element 1 is formed with a flat and square-shaped light sensing plane of pn junction including a high resistivity n-type Si substrate 2 and a ptype layer 3. On the p-type layer 3, a first electrode 4 and a second electrode 5 are formed near the two opposing side edges thereof. A first photoelectric current $I_1$ can be detected through the first electrode 4 and a second photoelectric current $I_2$ can be detected through the second electrode 5. On the other hand, an n+contact layer (not shown) is formed all over the outer surface of the Si substrate 2, and an electrode 6 is formed to receive a positive voltage $V_{ST}$ to reversely bias the pn junction of the sensing element. A signal processing circuit will be explained hereinbelow.

The processing circuit is composed of first and second current converting means; first and second logarithmic converting means; first and second source follower means; differential means; current-voltage converting means, etc. The first current converting means is a first current mirror circuit composed of two npn transistors 7 and 8. In the transistor 7, the base is connected to the collector, and the collector is connected to the first electrode 4 of the optical position sensing element 1. The first transistor 7 functions as an input transistor, and the second transistor 8 functions as an output transistor.

A first current $I_{11}$ roughly the same as the first photoelectric current $I_1$ flows through the collector of the output transistor 8. The relationship between the first current $I_{11}$ and the first photoelectric current $I_1$ can be expressed as $$I_{11} = I_1 \cdot hFE/(hFE+2) \quad (4)$$

where hFE denotes a common emitter current amplification factor.

In roughly the same way, the second current converting means is a second current mirror circuit composed of two npn transistors 9 and 11. In the transistor 9, the base is connected to the collector, and the collector is connected to the second electrode 5 of the optical position sensing element 1. The first transistor 9 functions as an input transistor, and the second transistor 11 functions as an output transistor.

A second current $I_{22}$ roughly the same as the second photoelectric current $I_2$ flows through the collector of the output transistor 11. The relationship between the second current $I_{22}$ and the first photoelectric current $I_2$ can be expressed as $$I_{22} = I_2 \cdot hFE/(hFE+2) \tag{5}$$

The collector of the output transistor 8 of the first current mirror circuit is connected to the emitter of the npn transistor 12, and the collector of the transistor 11 of the second current mirror circuit is connected to the emitter of the npn transistor 13. In these npn transistors 12 and 13, the base is connected to the collector, and a reference voltage $V_r$ is applied to the junction point between the base and the collector. A pair of logarithmic converters for converting the first and second currents $I_{11}$ and $I_{22}$ into two logarithmic voltage values, respectively can be obtained on the basis of the diode characteristics between the base and emitter of respective npn transistors 12 and 13. That is, a voltage $V_A$ obtained by logarithmically converting the first current $I_1$ is outputted from the emitter of the transistor 12, and a voltage $V_B$ obtained by logarithmically converting the second current $I_2$ is outputted from the emitter of the transistor 13.

The emitter of the logarithmic converting transistor 12 is connected to one input terminal of a differential circuit composed of two npn transistors 18 and 19 via a first source follower composed of a p-channel JFET (junction-gate type FET) 14 and a constant current source 16. The emitter of the logarithmic converting transistor 13 is connected to the other input terminal the differential circuit, composed of two transistors 18 and 19, via a second source follower composed of a p-channel JFET 15 and a constant current source 17.

These two source followers 14, 16 and 15, 17 serve to prevent base currents of the two transistors 18 and 19, which constitute the differential pair circuit from flowing to the logarithmic conversion transistors 12 and 13, respectively.

In order to obtain the same voltage difference (shift) between the input and output of source followers 14 and 15, the current of each of the constant current sources 16 and 17 is determined to be sufficiently large as compared with the base current of each of the transistors 18 and 19 which constitute the differential pair circuits.

Further, as described later in more detail, the JFET 14 as a first source follower is composed of a pair of parallel connected JFETs diagonally arranged close to each other on a semiconductor substrate. The JFET 15, as a second source follower, is composed of a pair of parallel connected JFETs diagonally arranged close to each other in intersectional positional relationship with respect to the first source follower JFETs. In other words, JFETs 14 and 15 for a source pair are formed by four JFETs arranged closely in double rows and double columns on a semiconductor substrate, by connecting in common two sources, two drains and two gates of these two JFETs, respectively, to reduce any difference in characteristics (e.g. saturation drain current $I_{DSS}$, pinchoff voltage ($V_p$, etc.) between the two JFETs 14 and 15. Further, in the same way, the constant current sources 16 and 17 are formed by four diagonally arranged JFETs in intersectional positional relationship with respect to each other, to reduce the difference in characteristics between the two JFETs 14 and 15 or 16 an 17.

Further, another current mirror circuit is formed by two npn transistors 23 and 24. The transistor 24, in which the base is connected to the collector, functions as an input transistor and the transistor, 23 functions as an output transistor. A bias voltage $(V_{ST}+V_{BE})$ is applied to a junction point between the base and the collector of the input transistor 24 via a resistor $R_B$. The collector of the output transistor 23 is connected to the common emitter junction point of the differential pair circuit. The collector current of the output transistor 23 is a constant reference current of the differential pair circuit 18 and 19, expressed as follows:

$$I_{ref} = V_{ST}/R_B \tag{6}$$

Another current mirror circuit is formed by two pnp transistors 21 and 22, as two active loads of the differential pair circuit 18 and 19. The collector of the transistor 18 of the differential pair circuit is connected to an input terminal 25 of the current mirror circuit, and the collector of the transistor 19 of the differential pair circuit is connected to an output terminal 26 thereof. This output terminal 26 of the current mirror circuit is connected to an inverting input terminal (−) of a current-voltage converter 27 formed of an operational amplifier.

In operation, the first and second photoelectric currents $I_1$ and $I_2$ are converted into the first and second current $I_{11}$ and $I_{22}$ by the two currents converting means (two current mirror circuits) 7, 8 and 9, 11, respectively. The two converted currents $I_{11}$ and $I_{22}$ are logarithmically converted into the two voltages $V_A$ and $V_B$ by the two logarithmic-converting means 12 and 13, respectively. These two logarithmically converted voltages $V_A$ and $V_B$ are applied to the differential pair circuit 18 and 19 via a pair of the source follower circuits 14, 16 and 15, 17, respectively. A first differential output current $I_A$ and a second differential output current $I_B$ are obtained by the differential pair circuit 18 and 19. The first differential output current $I_A$ flows through the input side of the active load current mirror circuit 21 and 22, and a second differential output current Is flows through the output side of this active load current mirror circuit. Therefore, it is possible to obtain a difference $I_f = (I_A - I_B)$ in differential output current between the two from the output terminal 26 of the active load current mirror circuit 21 and 22. This differential current If is applied to the nextstage current-voltage converter 27, to a non-inverting input terminal of which a positive voltage $V_{ST}/2$ is applied. By this C-V converter 27, the position currents $I_1$ and $I_2$ are converted into a position voltage Vout. A beam position on the semiconductor device can be detected on the basis of the output voltage of this converter 27, as described later in more detail.

Figure 3:
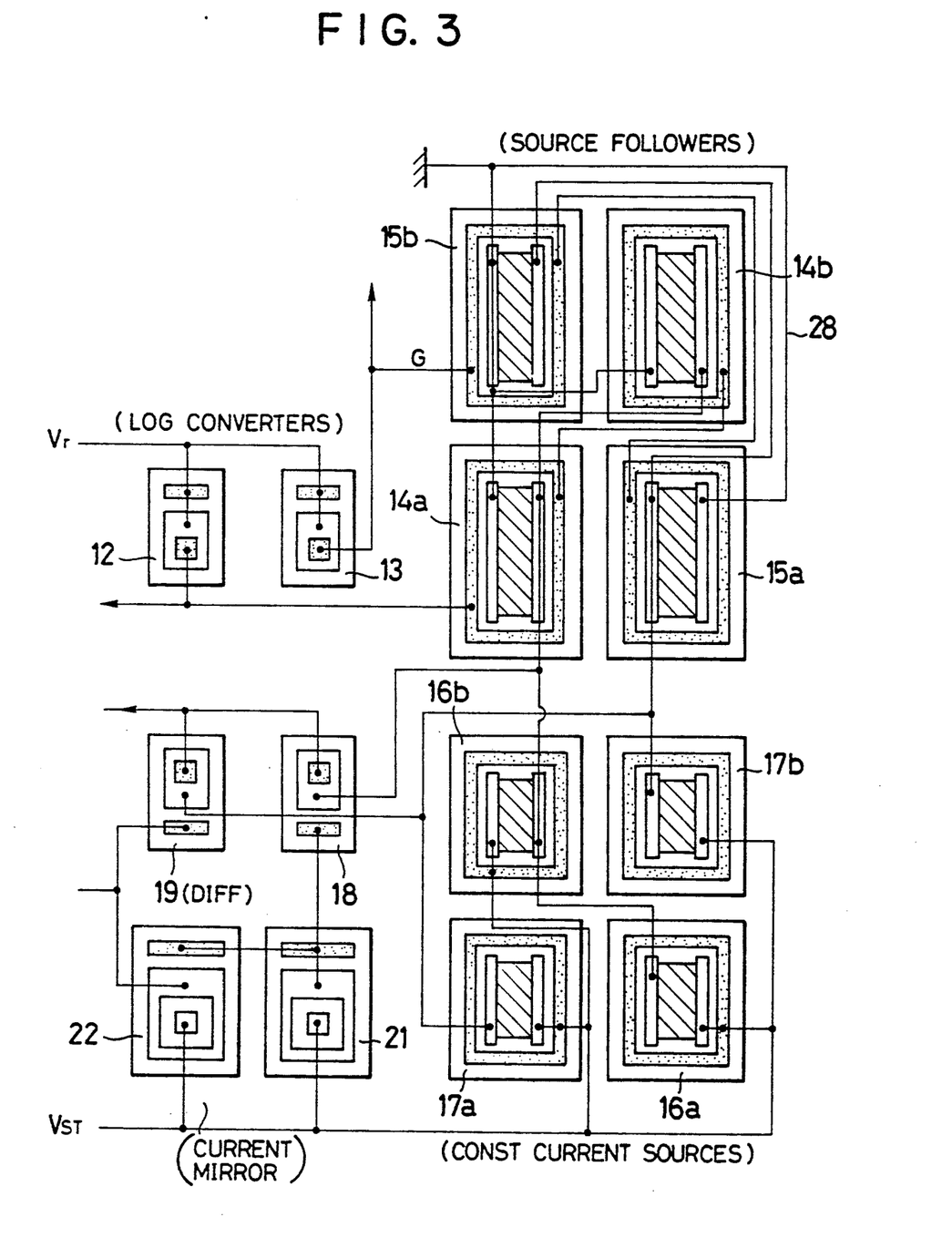
FIG. 3 is a plan view showing a layout of various elements such as junction type FET pairs.
Figure 4:
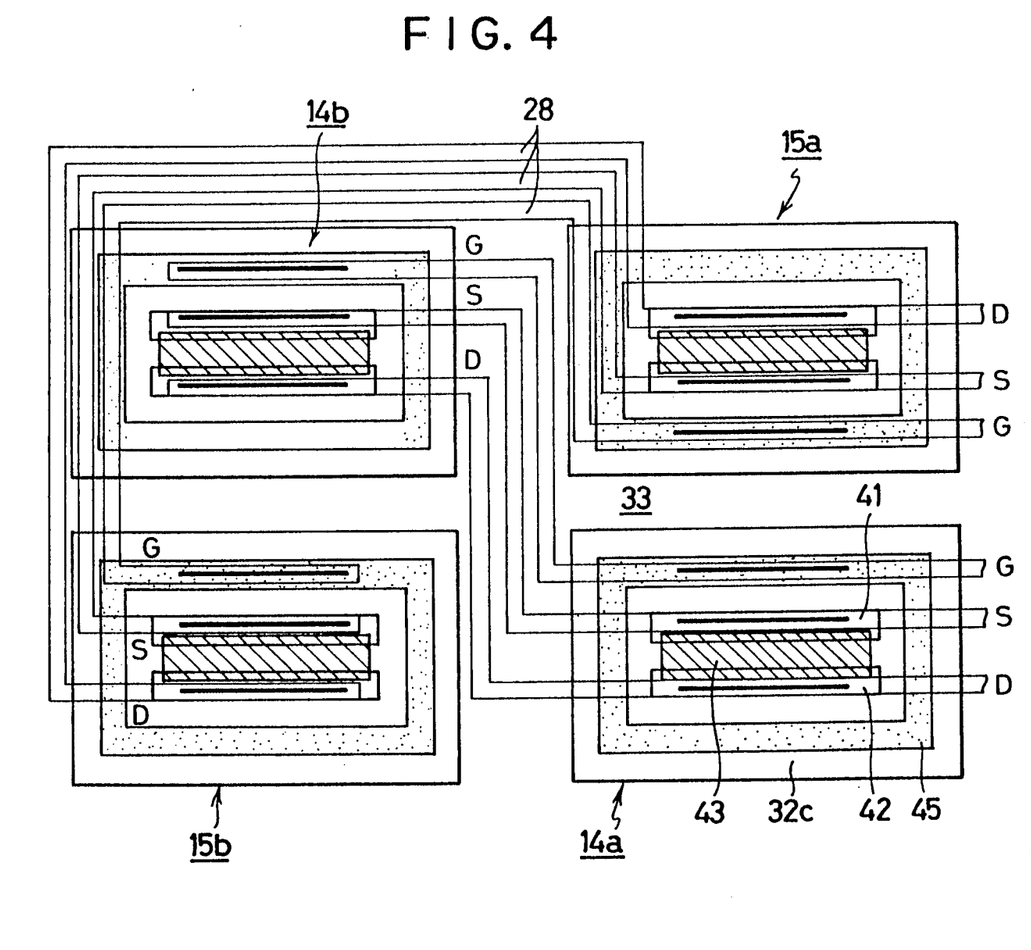
FIG. 4 is an enlarged plan view showing two diagonally arranged junction type FET pair shown in FIG. 3.

With reference to FIGS. 3 and 4, the layout of the transistor pairs will be explained. These transistor pairs are the diagonally-arranged source follower circuits of JFETs 14 and 15, 16 and 17; the logarithm converters of npn transistors 12 and 13; the differential circuit of npn transistors 18 and 19; and the active load current mirror circuit of pnp transistors 21 and 22. Further, FIG. 4 is an enlarged view showing the four parallel connected and diagonally arranged four JFETs 14 and 14b, 15a and 15b shown in FIG. 3.

That is, the JFET 14 is composed of a pair of diagonally arranged JFETs 14a and 14b, and the JFET 15 is composed of a pair of diagonally-arranged JFETs 15a and 15b. Further, these four JFETs are arranged in mutually intersectional positional relationship with respect to each other. As shown in FIG. 4, the JFET 14a is formed in an island 32c of an n⁻ epitaxial layer enclosed by a p⁺ separating diffusion region 33, and made up of a source region 41 of a p diffusion layer, a drain region 42, a p channel region 43 formed by implanting boron (B) ions between these two regions 41 and 42, and an gate electrode of an n+ diffusion layer 45 so formed as to enclose these element regions.

Other JFETs 14a, 15a, and 15b are all formed in the same way, and these four JFETs 14a, 14b, 15a and 15b are arranged close to each other in two lines and two columns on a semiconductor area in such a way that two sources, two drains and two gates of two diagonally-arranged JFETs 14a and 14b or 15a and 15b are connected to each other by Al wires 28, respectively to form a JFET pair 14a and 14b or 15a and 15b, each pair of which constitutes each source follower JFET 14 or 15. When two JFETs 14 and 15 are composed of four parallel-connected diagonally-arranged JFETs 14a, 14b, 15a and 15b, it is possible to minimize the difference in transistor characteristics (e.g. the saturation drain current $I_{DSS}$, pinch-off voltage $V_p$, etc.) between the two JFETs 14 and 15.

The two constant current sources 16 and 17 are similarly formed by four parallel-connected diagonally-arranged JFETs 16a, 16b and 17a, 17b, as shown in FIG. 3, in which the ratio (W/L) of the width to the length of each JFET 16a, 16b, 17a or 17b is determined to be a little smaller than that (W/L) of each JFET 14a, 14b, 15a or 15b. When the W/L ratio is increased a little, it is possible to make the effective operating points ($k = V_{GS}/V_p$) of the JFETs 16 and 17 more stable, because it is possible to more reliably minimize the difference in device characteristics (e.g. $I_{DSS}$, $V_p$, etc.) between the two JFETs 16 and 17.

Further, the logarithmic converting means is composed of a pair of npn transistors 12 and 13 arranged side by side; the differential pair circuit is composed of a pair of pnp transistors 18 and 19 arranged side by side; and the active load current mirror circuit is composed of a pair of npn transistors 21 and 22 arranged side by side, as shown in FIG. 3. Since all pairs of these transistors are arranged close to each other side by side, respectively, it is possible to minimize the difference in the transistor characteristics between the two transistors.

The above-mentioned logarithmic converting means 12 and 13, source follower means 14, 15, 16 and 17, and differential means 18, 19, 21, and 22 can be integrated into a single chip together with a bipolar integrated circuit including the optical position sensing element 1 and the current mirror circuits 7, 8, 9, and 11 which constitute current converting means.

Figure 5:
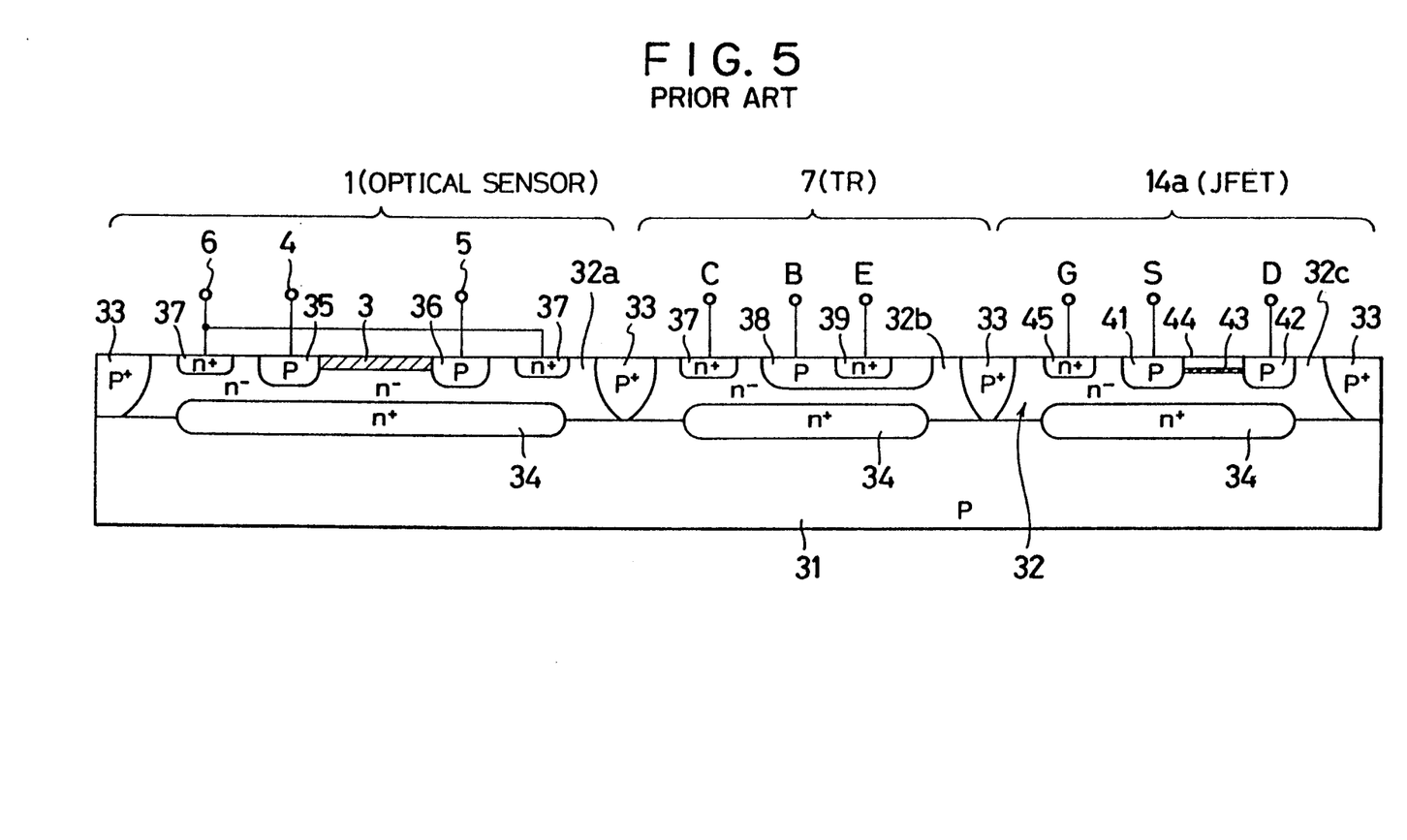
FIG. 5 is a longitudinal cross-sectional view showing a part of a single IC chip.

FIG. 5 shows in part an example of a single chip bipolar IC, in which the optical position sensing element 1, the npn transistor 7 and a p-channel JFET 14a are formed. In FIG. 5, an n− epitaxial layer 32 is formed as an n-type semiconductor region on a p-type silicon substrate 31. Some p+ isolation diffusion regions 33 are formed at different positions on the n− epitaxial layer 32 by selectively diffusing p-type impurity in such a way that each of islands 32a, 32b and 32c is surrounded by these p+ isolation diffusion ranges 33 in the n− epitaxial layer 32. Further, some n+ buried layers 34 are formed between the substrate 31 and the n− epitaxial layer 32, to reduce the collector resistance of each transistor.

The optical position sensing element 1 is formed in an island 32a. In more detail, two p-type regions 35 and 36 are formed by diffusion a predetermined distance away from each other, and a p-type high resistance layer 3 is formed between the two regions 35 and 36 by implanting boron (B) ions. Therefore, an optical sensing surface can be formed by a pn junction between the n− epitaxial layer 32 and the p-type high resistance layer 3 within the island 32a. Further, the numeral 37 denotes an n+ contact region.

An npn transistor 7 is formed in the island 32b, in which a p-type base diffusion region 38 is formed in the island 32b, and further an n+ emitter diffusion region 39 is formed in the p-type base diffusion region 38. A collector electrode is formed on the n+ collector region 37.

A p-channel JFET 14a is formed in an island 32c. A pair of p-type source and drain regions 41 and 42 are oppositely formed a predetermined distance away from each other, and a p-channel region 43 is formed between the source region 41 and the drain region 42 by implanting boron (B) ions. An n+ gate region 44 is formed on the p-channel region 43, and a gate electrode is formed on the n+ gate region 45.

The p-type regions 35, 36, 38, 41 and 42 in each island 32a, 32b and 32c can be formed simultaneously by diffusing a p-type impurity, and n-type regions 37, 39 and 45 can be formed simultaneously by diffusing n-type impurity.

Further, in FIG. 5, although only a single npn transistor 7 and a simple p-channel JFET 14a are shown, in practice, other transistors and JFETs can be formed simultaneously in the epitaxial layer 32 on another island (not shown) within a single chip.

The operation of the semiconductor optical position sensing device according to the present invention, constructed as described above, will be explained.

When an optical beam spot is allowed to be incident upon a position X between the two electrodes 4 and 5 of the optical position sensing element 1, a first photoelectric current $I_1$ and a second photoelectric current $I_2$ are outputted from the electrodes 4 and 5 according to the optical beam position as expressed by the afore-mentioned formulae (1) and (2).

The first photoelectric current $I_1$ flows through the input transistor 7 of the first current mirror circuit (first current converting means) so that a first current $I_{11}$ is generated at the collector of the output transistor 8 thereof as expressed by the formula (4).

On the other hand, the second photoelectric current $I_2$ flows through the input transistor 9 of the second current mirror circuit (second current converting means), so that a second current $I_{22}$ is generated at the collector of the output transistor 11 thereof as expressed by the formula (5).

The first current $I_{11}$ flowing through the transistor 12 (logarithmic converting means) is logarithmically converted into an emitter voltage $V_A$ as expressed below. The second current $I_{22}$ flowing through the transistor 13 (logarithmic converting means) is logarithmically converted into an emitter voltage $V_B$ as expressed below.

$$V_A = V_r - (kT/q) \cdot \ln(A_1 \cdot I_{11}/I_s) \qquad (7)$$

$$V_B = V_r - (kT/q) \cdot \ln(A_1 \cdot I_{22}/I_s) \qquad (8)$$

where
k : Boltzmann constant
q : electron charge
$I_s$: reverse saturation current of transistor base/emitter junction
$A_1$: $H_{FE}/(H_{FE}+1)$ The converted voltages $V_A$ and $V_B$ are inputted to the differential pair circuit 18 and 19 (differential means) via the two source followers 14 and 15, so that a first differential output current $I_A$ is generated through the collector of the transistor 18 and a second differential output current $I_B$ is generated through the collector of the transistor 19. Here, it should be noted that the source follower 14 is composed of the two parallel-connected diagonally-arranged JFETs 14a and 14b and the source follower 15 is composed of the two parallel-connected diagonally-arranged JFETs 15a and 15b as already described with reference to FIGS. 3 and 4. Further, the two constant current sources 16 and 17 are also formed in the same way by four parallel-connected diagonally arranged JFETs 16a, 16b and 17a, 17b. Therefore, it is possible to reduce the difference in characteristics (e.g. pinch off voltage $V_p$) between the two source followers 14 and 15 (inevitably produced during the manufacturing process) as small as possible. In other words, since the source-gate voltage $V_{GS}$ of JFET 14 is substantially equal to that of JFET 15, it is possible to effectively minimize an offset error produced in the differential circuit composed of the two transistors 18 and 19. First and second differential output currents $I_A$ and $I_B$ having a minimized offset error of $V_{GS}$ can be given by the following formulae:

$$I_A = I_{ref}/[1+\exp\{(q/kT)\cdot(V_B-V_A)\}] = I_{ref}\cdot I_{22}/(I_{11}+I_{22}) \quad (9)$$

$$I_B = I_{ref}/[1+\exp\{(q/kT)\cdot(V_A-V_B)\}] = I_{ref}\cdot I_{11}/(I_{11}+I_{22}) \quad (10)$$

Here, $I_{ref}$ can be obtained in accordance with the formula (6). Further, since $h_{FE}$ is much larger than 2 in the formulae (4) and (5), it is possible to obtain the two currents as $$I_{11} \approx I_1$$

$$I_{22} \approx I_2$$

Further, since a current mirror circuit composed of two transistors 21 and 22 is connected to the differential circuit composed of two transistors 18 and 19, as an active load, an optical position current signal If corresponding to an optical position (X) between the two electrodes 4 and 5 of the optical position sensing element 1 can be obtained through an output terminal 26 of the current mirror circuit on the basis of the first and second differential output currents $I_A$ and $I_B$ as $$I_f = I_A - I_B = I_{ref}(I_2 - I_1)/(I_1 + I_2) \quad (11)$$

The thus obtained position current signal If is applied to an inverting input terminal (−) of a current-voltage (I-V) converter (I-V converting means) 27 for conversion into a voltage, so that the following output voltage $V_{out}$ can be obtained from the current-voltage converter 27:

$$V_{out} = V_{ST}/2 + R_f \cdot I_{ref}(I_2 - I_1)/(I_1 + I_2) \quad (12)$$

where $V_{ST}$ denotes a reference voltage applied to a non-inverting input terminal (+) of the I-V converter 27; $R_f$ denotes a feedback resistance of the I-V converter 27; and $I_{ref}$ denotes a constant current flowing through the collector of the output transistor 23.

By substituting the two formulae (1) and (2) for the first and second photoelectric currents $I_1$ and $I_2$, and further the formulae (6) for the constant current $I_{ref}$ in the formulae (12), $V_{out}$ can be expressed as $$V_{OUT} = [\frac{1}{2} + (X/L - \frac{1}{2})/2 \cdot R_f/R_B] \cdot V_{ST} \quad (13)$$

Here, if $R_B = 2R_f$, the above formula is $$V_{OUT} = V_{ST} \times X/L \quad (14)$$

Since L denotes a fixed value, it is possible to detect the beam position by measuring the output voltage $V_{OUT}$ of the I-V converter 27.

As described above, in the optical position sensing device according to the present invention, since the optical position sensing element 1 and the various elements of the signal processing circuit can be integrated into a single chip and therefore the first and second photoelectric currents $I_1$ and $I_2$ can be processed within the same single chip, it is possible to improve the S/N ratio and the sensing precision, by compensating for leakage current of the optical position sensing element 1 within the same chip, thus improving the reliability of the optical position sensing device.

Figure 6:
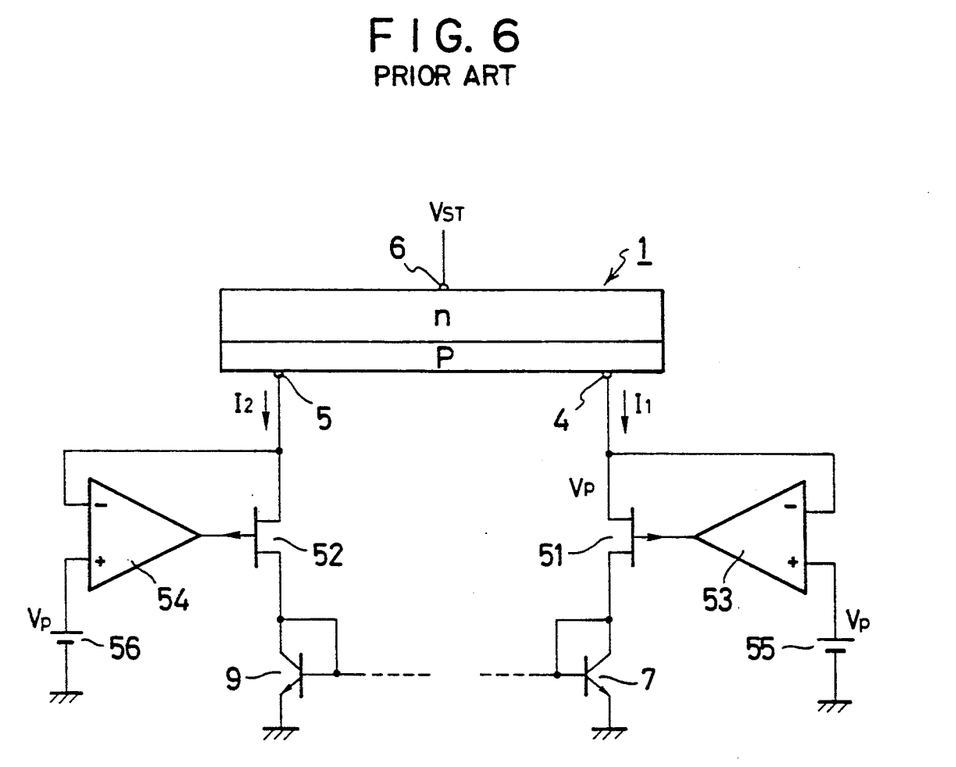
FIG. 6 is a circuit diagram showing another embodiment of the present invention.

FIG. 6 shows another embodiment of the device according to the present invention. In this embodiment, each electrode 4 or 5 of the optical position sensing element 1 is connected to each input transistor 7 or 9 of the first or second current mirror circuit via a constant voltage buffer circuit. Each buffer circuit is composed of a p-channel JFET 51 or 52, an operational amplifier 53 or 54 and a constant voltage source 55 or 56 connected to each non-inverting input terminal (+) of each operational amplifier, respectively.

The first electrode 4 of the optical position sensing element 1 is connected to the source of the JFET 51, and the drain of the JFET 51 is connected to the input transistor 7 of the first current mirror circuit. The inverting (−) input terminal of the operational amplifier 53 is connected to the source of the JFET 51, and the output terminal of the operational amplifier 53 is connected to the gate of the JFET 51. Since the gate of the JFET 51 is activated by the operational amplifier 53, the source potential of the JFET 51 remains at a constant voltage $V_p$.

The second electrode 5 of the optical position sensing element 1 is connected to the input transistor 9 of the second current mirror circuit via the buffer circuit in the same way.

In the first embodiment shown in FIG. 2, when the first and second photoelectric currents $I_1$ and $I_2$ of the optical position sensing element 1 change, since the emitter-base voltage of each input transistor 7 or 9 of the first or second current mirror circuit also change, a bias voltage to the optical position sensing element 1 changes. Since the difference in current between the two photoelectric currents $I_1$ and $I_2$ increases as the optical position is shifted toward either end of the optical sensing surface, the bias voltage to the optical position sensing element 1 also changes, thus there exists a problem in that an optical position sensing error inevitably occurs when the optical position is near the end of the sensing surface. In this second embodiment, however, since it is possible to maintain the bias voltage of the optical position sensing element 1 at a constant voltage of $(V_{ST} - V_p)$ even if the first and second photoelectric currents $I_1$ and $I_2$ change, it is possible to effectively prevent the optical position sensing error due to change in bias voltage to the sensing element 1.

As described above, the semiconductor optical position sensing device according to the present invention comprises an optical position sensing element 1, two current mirror circuits (two current converting means) 7, 8 and 9, 11; two transistors (two logarithmic converting means) 12 and 13; two source followers 14, 16 and 15, 17; a differential circuit 18, 19 and 21, 22; and a C-V converter 27. Further, since the two source followers 14 and 15 are composed of four parallel-connected JFETs 14a and 14b or 15a and 15b diagonally arranged close to each other in intersectional positional relationship with respect to each other and, additionally, since the two constant current sources 16 and 17 are composed of four similarly-arranged JFETs, it is possible to effectively eliminate an offset error in the differential circuit due to difference in pinch off voltage between the two source followers JFETs 14 and 15. Further, since the two source followers 14 and 15 are connected between the two transistors 12 and 13 and the differential circuit transistors 18 and 19, respectively, it is possible to effectively present interference between the two transistors 12 and 13 and the differential circuit transistors 18 and 19. Accordingly, it is possible to realize a high reliable optical position sensing device. Further, since no divider circuit is required for the signal processing circuit, it is possible to integrate all of the composing elements into a single chip, thus improving its reliability and decreasing its size and the cost.

What is claimed is:

1. A semiconductor optical position sensing device, comprising:
   (a) optical position sensing means having first and second electrodes for generating first and second photoelectric currents, respectively, so as to be relatively changed according to the optical position between the first and second electrodes;
   (b) first current converting means connected to the first electrode of said sensing means, for converting the first photoelectric current into a first current;
   (c) second current converting means connected to the second electrode of said sensing means, for converting the second photoelectric current into a second current;
   (d) first logarithmic converting means connected to said first current converting means, for logarithmically converting the first current into a first voltage;
   (e) second logarithmic converting means connected to said second current converting means, for logarithmically converting the second current into a second voltage;
   (f) first source follower means connected to said first logarithmic converting means, for isolating said first logarithmic converting means from the succeeding stage, said first source follower means including:
      (1) a pair of first parallel connected source follower field effect transistors diagonally arranged close to each other on a semiconductor substrate; and
      (2) a pair of first parallel connected constant current source field effect transistors diagonally arranged close to each other on the semiconductor substrate, and connected to sources of a pair of said first parallel connected source follower field effect transistors, and
   (g) second source follower means connected to said second logarithmic converting means, for isolating said second logarithmic converting means from the succeeding stage, said second source follower means including:
      (1) a pair of second parallel connected source follower field effect transistors diagonally arranged close to each other in intersectional positional relationship with respect to the first source follower field effect transistors on the semiconductor substrate; and
      (2) a pair of second parallel connected constant current source field effect transistors diagonally arranged close to each other in intersectional positional relationship with respect to the first constant current source field effect transistors on the semiconductor substrate, and connected to sources of a pair of said second parallel connected source follower field effect transistors, and
   (h) differential means connected between said first and second logarithmic converting means via said first and second source follower means, respectively, for differentially generating an optical position current signal on the basis of the first and second voltages.

2. The semiconductor optical position sensing device of claim 1, wherein said first source follower means comprises:
   (a) a pair of first parallel connected source follower field effect transistors diagonally arranged adjacent to each other on a semiconductor substrate; and
   (b) ak pair of first parallel connected constant current source field effect transistors diagonally arranged adjacent to each other on the semiconductor substrate, and connected to sources of a pair of said first parallel connected source follower field effect transistors, and wherein said second source follower means comprises:
   (c) a pair of second parallel connected source follower field effect transistors diagonally arranged adjacent to each other in intersectional positional relationship with respect to the first source follower field effect transistors on the semiconductor substrate; and
   (d) a pair of second parallel connected constant current source field effect transistors diagonally arranged adjacent to each other in intersectional positional relationship with respect to the first constant current source field effect transistors on the semiconductor substrate, and connected to sources of a pair of said second parallel connected source follower field effect transistors.

* * * * *